United States Patent
Yang (10) Patent No.: US 11,983,108 B2
(45) Date of Patent: May 14, 2024

(54) METHOD AND APPARATUS FOR DETERMINING ADDRESS MAPPING RELATIONSHIP, AND STORAGE MEDIUM

(71) Applicant: CHANGXIN MEMORY TECHNOLOGIES, INC., Hefei (CN)

(72) Inventor: Kai Yang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 52 days.

(21) Appl. No.: 17/814,261

(22) Filed: Jul. 22, 2022

(65) Prior Publication Data

US 2023/0376413 A1    Nov. 23, 2023

Related U.S. Application Data

(63) Continuation of application No. PCT/CN2022/097512, filed on Jun. 8, 2022.

(30) Foreign Application Priority Data

May 19, 2022    (CN) .......................... 202210547364.6

(51) Int. Cl.
*G06F 12/06* (2006.01)

(52) U.S. Cl.
CPC .......... *G06F 12/06* (2013.01); *G06F 2212/70* (2013.01)

(58) Field of Classification Search
None
See application file for complete search history.

(56) References Cited

U.S. PATENT DOCUMENTS

| | | | |
|---|---|---|---|
| 6,351,797 B1 | 2/2002 | Beard, Sr. et al. | |
| 8,015,389 B2 | 9/2011 | Sato et al. | |
| 11,030,089 B2 | 6/2021 | Boals et al. | |
| 2015/0089183 A1* | 3/2015 | Bains | G06F 12/0292 711/202 |
| 2016/0253123 A1* | 9/2016 | Jacob | G06F 12/0806 711/103 |

FOREIGN PATENT DOCUMENTS

| | | |
|---|---|---|
| CN | 101206912 A | 6/2008 |
| CN | 112912859 A | 6/2021 |
| CN | 113689902 A | 11/2021 |
| CN | 114237710 A | 3/2022 |

OTHER PUBLICATIONS

International Search Report cited in PCT/CN2022/097512 dated Dec. 7, 2022, 9 pages.

* cited by examiner

*Primary Examiner* — Charles J Choi
(74) *Attorney, Agent, or Firm* — Cooper Legal Group, LLC (57) ABSTRACT

The present disclosure relates to the technical field of semiconductors, and provides a method and an apparatus for determining an address mapping relationship, and a storage medium. The method for determining an address mapping relationship includes: obtaining a mapping relationship table between preset addresses and DRAM physical addresses under a preset condition; and analyzing values of bit addresses in the DRAM physical address according to a first preset rule, to determine an attribute of each bit address in the DRAM physical address, where the attribute is used for representing an address field of the DRAM physical address.

11 Claims, 5 Drawing Sheets

| 31-24 | 23-16 | 15-8 | 7-0 | 31-24 | 23-16 | 15-8 | 7-0 | Channel field | Rank field | Bank field | Row field | Column field | Chip field |
|---|---|---|---|---|---|---|---|---|---|---|---|---|---|
| 0 | 0c | d9 | fc | 00000000 | 00001100 | 11011001 | 11111100 | 0 | 0 | 2 | 0x8006 | 0x370 | 0 |
| 1 | 0c | d9 | fc | 00000001 | 00001100 | 11011001 | 11111100 | 0 | 0 | 3 | 0x8086 | 0x370 | 0 |
| 2 | 0c | d9 | fc | 00000010 | 00001100 | 11011001 | 11111100 | 0 | 0 | 3 | 0x8106 | 0x370 | 0 |
| 3 | 0c | d9 | fc | 00000011 | 00001100 | 11011001 | 11111100 | 0 | 0 | 2 | 0x8186 | 0x370 | 0 |
| 4 | 0c | d9 | fc | 00000100 | 00001100 | 11011001 | 11111100 | 0 | 0 | 0 | 0x8206 | 0x370 | 0 |
| 5 | 0c | d9 | fc | 00000101 | 00001100 | 11011001 | 11111100 | 0 | 0 | 1 | 0x8286 | 0x370 | 0 |
| 6 | 0c | d9 | fc | 00000100 | 00001100 | 11011001 | 11111100 | 0 | 0 | 1 | 0x8306 | 0x370 | 0 |
| 7 | 0c | d9 | fc | 00000111 | 00001100 | 11011001 | 11111100 | 0 | 0 | 0 | 0x8386 | 0x370 | 0 |
| 8 | 0c | d9 | fc | 00001000 | 00001100 | 11011001 | 11111100 | 0 | 0 | 6 | 0x8406 | 0x370 | 0 |
| 9 | 0c | d9 | fc | 00001001 | 00001100 | 11011001 | 11111100 | 0 | 0 | 7 | 0x8486 | 0x370 | 0 |
| 0a | 0c | d9 | fc | 00001010 | 00001100 | 11011001 | 11111100 | 0 | 0 | 7 | 0x8506 | 0x370 | 0 |
| 0b | 0c | d9 | fc | 00001011 | 00001100 | 11011001 | 11111100 | 0 | 0 | 6 | 0x8586 | 0x370 | 0 |
| 0c | 0c | d9 | fc | 00001100 | 00001100 | 11011001 | 11111100 | 0 | 0 | 4 | 0x8606 | 0x370 | 0 |
| 0d | 0c | d9 | fc | 00001101 | 00001100 | 11011001 | 11111100 | 0 | 0 | 5 | 0x8686 | 0x370 | 0 |
| 0e | 0c | d9 | fc | 00001110 | 00001100 | 11011001 | 11111100 | 0 | 0 | 5 | 0x8706 | 0x370 | 0 |
| 0f | 0c | d9 | fc | 00001100 | 00001100 | 11011001 | 11111100 | 0 | 0 | 4 | 0x8786 | 0x370 | 0 |

| Channel field (bit31) | Rank field (bits28-30) | Bank field (bits25-27) | Row field (bits12-24) | Column field (bits1-11) | Chip field (bit0) |

FIG. 5

| Channel field (1bit) | Rank field (3bits) | Bank field (3bits) | Row field (13bits) | Column field (11bits) | Chip field (1bit) |

FIG. 6

S701
Determine the preset bit address according to the bit addresses in the DRAM physical address in a descending order S702
Select a plurality of DRAM physical addresses with different values of the preset bit address

METHOD AND APPARATUS FOR DETERMINING ADDRESS MAPPING RELATIONSHIP, AND STORAGE MEDIUM

CROSS-REFERENCE TO RELATED APPLICATIONS

This is a continuation of International Application No. PCT/CN2022/097512, filed on Jun. 8, 2022, which is based on and claims priority to Chinese Patent Application No. 202210547364.6, titled "METHOD AND APPARATUS FOR DETERMINING ADDRESS MAPPING RELATIONSHIP, AND STORAGE MEDIUM" and filed on May 19, 2022. The entire contents of International Application No. PCT/CN2022/097512 and Chinese Patent Application No. 202210547364.6 are herein incorporated into the present disclosure by reference.

TECHNICAL FIELD

The present disclosure relates to, but is not limited to, a method and an apparatus is for determining an address mapping relationship, and a storage medium.

BACKGROUND

For security reasons, the suppliers of semiconductor devices generally do not provide the address mapping relationship of dynamic random access memory (DRAM) physical addresses, i.e., the suppliers do not provide the composition of DRAM physical addresses, which brings trouble to analysis and solution of DRAM-related problems. In the related art, tools for analyzing DRAM physical address information include DRAMA and DRAMDig, but these methods suffer from the interference of the cache and system, resulting in inaccurate and unstable parsing of the DRAM physical address information.

SUMMARY

An overview of the subject described in detail in the present disclosure is provided below, which is not intended to limit the protection scope of the claims.

The present disclosure provides a method and an apparatus for determining an address mapping relationship, and a storage medium.

According to a first aspect of the present disclosure, a method for determining an address mapping relationship is provided, where the method includes:
 obtaining a mapping relationship table between preset addresses and DRAM physical addresses under a preset condition; and
 analyzing values of bit addresses in the DRAM physical address according to a first preset rule, to determine an attribute of each bit address in the DRAM physical address, where the attribute is used for representing an address field of the DRAM physical address.

According to a second aspect of the present disclosure, an apparatus for determining an address mapping relationship is provided, where the apparatus includes:
 one or more processors; and
 a storage apparatus, configured to store one or more programs, wherein the one or is more programs, when executed by the one or more processors, cause the one or more processors to execute operations of:
 obtaining a mapping relationship table between preset addresses and DRAM physical addresses under a preset condition; and
 analyzing values of bit addresses in the DRAM physical address according to a first preset rule, to determine an attribute of each bit address in the DRAM physical address, where the attribute is used for representing an address field of the DRAM physical address.

According to a third aspect of the present disclosure, a non-transitory computer readable storage medium is provided, where when executed by a processor of an apparatus for determining an address mapping relationship, instructions in the non-transitory computer readable storage medium enable the apparatus to execute the method for determining an address mapping relationship provided in the exemplary embodiments of the present disclosure.

Other aspects of the present disclosure are understandable upon reading and understanding of the accompanying drawings and detailed description.

BRIEF DESCRIPTION OF THE DRAWINGS

The accompanying drawings incorporated into the specification and constituting a part of the specification illustrate the embodiments of the present disclosure, and are used together with the description to explain the principles of the embodiments of the present disclosure. In these accompanying drawings, similar reference numerals are used to represent similar elements. The accompanying drawings in the following description are some rather than all of the embodiments of the present disclosure. Those skilled in the art may obtain other accompanying drawings based on these accompanying drawings without creative efforts.

DETAILED DESCRIPTION

To make the objectives, technical solutions, and advantages of the embodiments of the present disclosure clearer, the following clearly and completely describes the technical solutions in the embodiments of the present disclosure with reference to the accompanying drawings in the embodiments of the present disclosure. Apparently, the described embodiments are some but not all of the embodiments of the present disclosure. All other embodiments obtained by those skilled in the art based on the embodiments of the present disclosure without creative efforts should fall within the protection scope of the present disclosure. It should be noted that the embodiments in is the present disclosure and features in the embodiments may be combined with each other in a non-conflicting manner.

The present disclosure provides a method for determining an address mapping relationship. The method includes: obtaining a mapping relationship table between preset addresses and DRAM physical addresses under a preset condition; and analyzing values of bit addresses in the DRAM physical address according to a first preset rule, to determine an attribute of each bit address in the DRAM physical address, where the attribute is used for representing an address field of the DRAM physical address. By analyzing values of bit addresses in a DRAM physical address, an address field corresponding to each bit address in the DRAM physical address is determined, such that composition of the DRAM physical address can be obtained through parsing, which facilitates degubbing, modification and analysis of problems related to the DRAM physical address, and improves the accuracy and efficiency of evaluating threats of the loophole, such as rowhammer, of the DRAM physical address.

In a computer, all types of file, information, and data are stored in a computer memory, such as a dynamic random access memory (DRAM), in the form of a binary string such as 0101011. The DRAM needs to be accessed during the operation of a related program of the computer, to read stored data from or write new data to the DRAM. This process is implemented by a memory controller in the central processing unit (CPU) of the memory, which controls access to a physical address in the DRAM to implement read or write operation for the DRAM physical address. If attributes of bit addresses of the DRAM physical address are not disclosed, it is extremely difficult to trace and analyze the problems that occur during the access to the DRAM physical address. In an exemplary embodiment of the present disclosure, a method for determining a DRAM physical address mapping relationship is provided, i.e., a method for determining an address mapping relationship in a DRAM physical address is provided.

Figure 1:
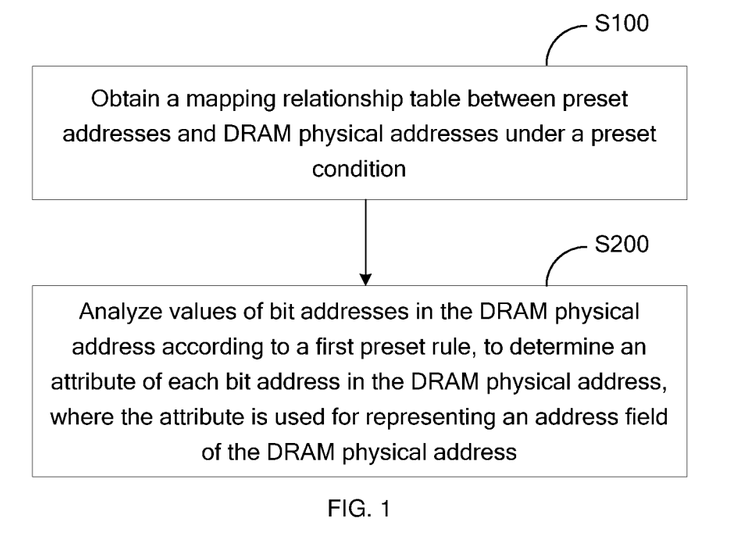
FIG. 1 is a flowchart of a method for determining an address mapping relationship according to an exemplary embodiment.

As shown in FIG. 1, an exemplary embodiment of the present disclosure provides a method for determining an address mapping relationship. The method includes:

Step S100: Obtain a mapping relationship table between preset addresses and DRAM physical addresses under a preset condition.

Step S200: Analyze values of bit addresses in the DRAM physical address according to a first preset rule, to determine an attribute of each bit address in the DRAM physical address, where the attribute is used for representing an address field of the DRAM physical address.

In step S100, the preset addresses may be a plurality of address sequences for measurement. According to the plurality of address sequences, a memory controller in a CPU performs read and write operations on DRAM physical addresses, to determine a mapping relationship between the plurality of address sequences and the DRAM physical addresses. Based on the determined mapping relationship between the plurality of address sequences and the DRAM physical addresses, values of bit addresses in the DRAM physical address are analyzed according to a first preset rule, to determine an attribute of each bit address in the DRAM physical address, i.e., determine an address field of the DRAM physical address represented by each bit address in the DRAM physical address.

The memory controller of the CPU performs read and write operations on the DRAM physical addresses. Different DRAM physical addresses are described by using address fields related to one or more of channel, rank, bank, byte, row, and column controlled by the memory controller. That is, the DRAM physical address may be described by using one or more of the following address fields: a channel field, a rank field, a chip field, a bank field, a byte field, a row field, and a column field, such that a physical location of the DRAM physical address can be determined.

Figure 2:
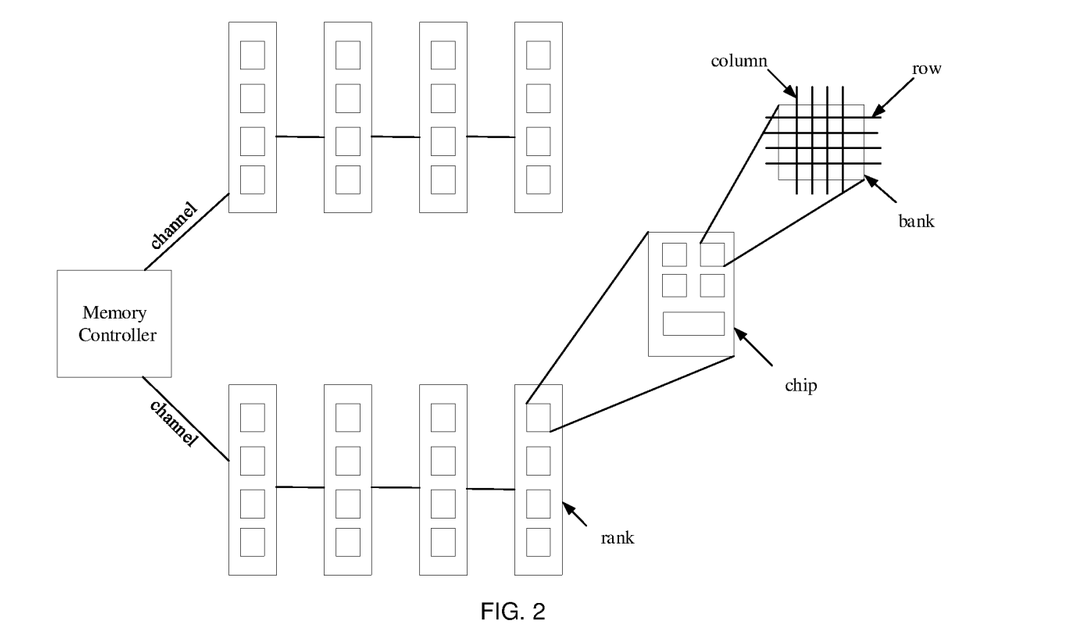
FIG. 2 is a schematic diagram of an address mapping relationship according to an exemplary embodiment.

As shown in FIG. 2, FIG. 2 is a schematic diagram of an address mapping relationship according to an exemplary embodiment of the present disclosure. In the schematic diagram of FIG. 2, address fields of the DRAM physical address include a channel field, a rank field, a chip field, a bank field, a row field, and a column field. As shown in FIG. 2, in the DRAM physical address, the bit address representing the channel field is used for indicating a channel that controls the DRAM physical address; the bit address representing the rank field is used for indicating a rank in which the DRAM physical address is located; the bit address representing the chip field is used for indicating a chip in which the DRAM physical address is located; the bit address representing the bank field is used for indicating a bank in which the DRAM physical address is located; the bit address representing the row field is used for indicating a row in which the DRAM physical address is located; and the bit address representing the column field is used for indicating a column in which the DRAM physical address is located. In this way, a physical location of each DRAM physical address can be described clearly.

In an exemplary embodiment of the present disclosure, a mapping relationship between the preset address sequences and the DRAM physical addresses is determined, and values of bit addresses in each DRAM physical address are analyzed according to the mapping relationship, to determine an address mapping relationship in the DRAM physical address, i.e., determine attributes of the bit addresses in the DRAM physical address. In this way, a physical location of each DRAM physical address can be clearly determined, which can trace and analyze problems that occur during access to the DRAM physical address, and improve the accuracy and efficiency of evaluating threats caused by the hardware problem of the DRAM physical address.

In an exemplary embodiment of the present disclosure, to analyze the attribute of each bit address in the DRAM physical address, after the mapping relationship table between the preset addresses and the DRAM physical addresses is obtained, a plurality of DRAM physical addresses with different values of a preset bit address can be selected, and an attribute of the preset bit address is determined according to an address field of the DRAM physical addresses that is affected by the preset bit address. That is, the analyzing values of bit addresses in the DRAM physical address according to a first preset rule, to determine an attribute of each bit address in the DRAM physical address may include:

selecting a plurality of DRAM physical addresses with different values of a preset bit address, and determining an address field of the DRAM physical addresses that is affected by the preset bit address, to determine an attribute of the preset bit address.

Figure 3:
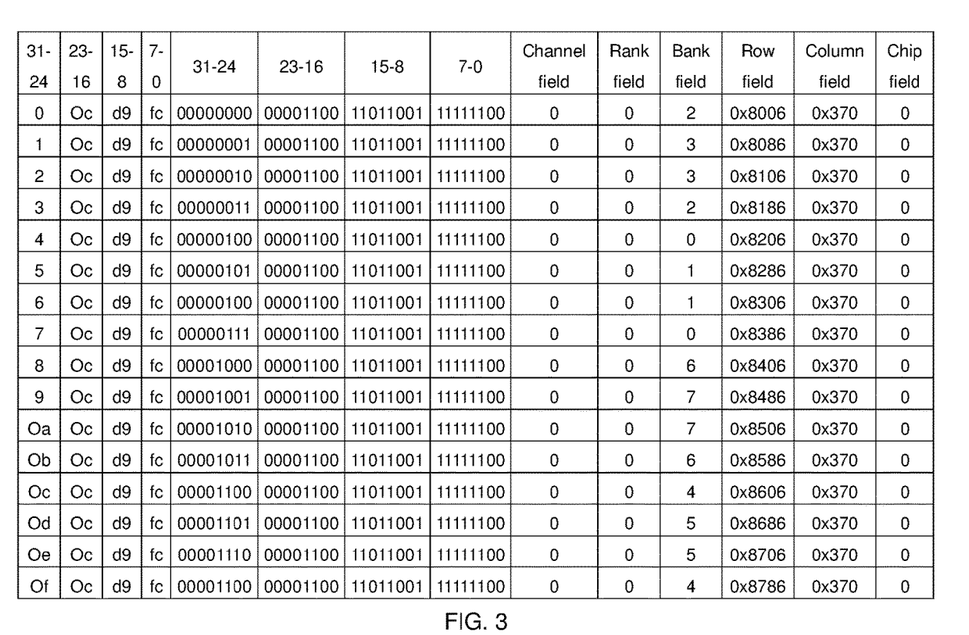
FIG. 3 is a mapping relationship table between preset addresses and DRAM physical addresses according to an exemplary embodiment.

As shown in FIG. 3, FIG. 3 is a mapping relationship table between preset addresses and DRAM physical addresses according to an exemplary embodiment of the present disclosure. The DRAM physical address includes 32 bits, i.e., bit addresses 0 to 31. The is four columns on the left side describe hexadecimal values of every 8 bits of each DRAM physical address; the four columns in the middle describes binary values of every 8 bits of each DRAM physical address; and other columns describe address fields that change with a value of a corresponding bit address. In FIG. 3, address fields that describe the DRAM physical address include a channel field, a rank field, a bank field, a row field, a column field, and a chip field.

As shown in FIG. 3, the preset bit address may be bit addresses 24 to 27 in the bit addresses of the DRAM physical address. In a plurality of DRAM physical addresses, the preset bit address, that is, bit addresses 24 to 27, have different values. As the bit addresses 24 to 27 in the bit addresses of the DRAM physical address change, values of the corresponding bank field and row field also change, indicating that the bit addresses 24 to 27 in the bit addresses of the DRAM physical address affect the bank field and the row field, that is, the bit addresses 24 to 27 in the bit addresses of the DRAM physical address represent the bank field and the row field.

Based on this method, the preset bit address may be set to other bits in the bit addresses of the DRAM physical address, to select a plurality of DRAM physical addresses with different values of these bits, and attributes of these bits, i.e., address fields of the DRAM physical address represented by these bits, can be determined by analyzing values of fields affected by the changing values of these bit addresses. In a similar manner, the attribute of each bit address in the DRAM physical address is determined, that is, address fields of the DRAM physical address that are represented by each bit address are determined.

Figure 4:
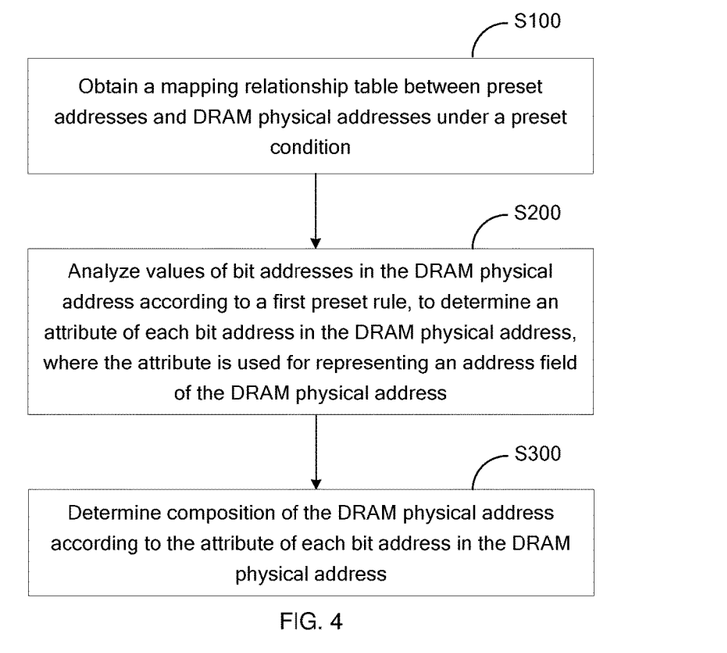
FIG. 4 is a flowchart of a method for determining an address mapping relationship according to an exemplary embodiment.

In an exemplary embodiment of the present disclosure, as shown in FIG. 4, FIG. 4 is a flowchart of a method for determining an address mapping relationship according to an exemplary embodiment. In the method for determining an address mapping relationship shown in FIG. 4, after the steps of obtaining a mapping relationship table between preset addresses and DRAM physical addresses, and analyzing values of bit addresses in the DRAM physical address according to a first preset rule, to determine an attribute of each bit address in the DRAM physical address, composition of the DRAM physical address can be determined according to the determined attribute of each bit address in the DRAM is physical address:

Step S300: Determine composition of the DRAM physical address according to the attribute of each bit address in the DRAM physical address.

After the attribute of each bit address in the DRAM physical address is obtained, composition of the DRAM physical address can be determined. That is, after the address field represented by each bit address in the DRAM physical address is determined, the composition of the DRAM physical address is determined according to the address field represented by each bit address in the DRAM physical address. The address field may include one or more of a channel field, a rank field, a chip field, a bank field, a byte field, a row field, and a column field. Each DRAM physical address is described by using corresponding address fields, such that a physical location of the DRAM physical address can be determined accurately.

The composition of the DRAM physical address may include address fields of the DRAM physical address, and bits that describe these address fields. Alternatively, the composition may include bits that describe each address field and locations of the bits in the DRAM physical address.

Figure 5:
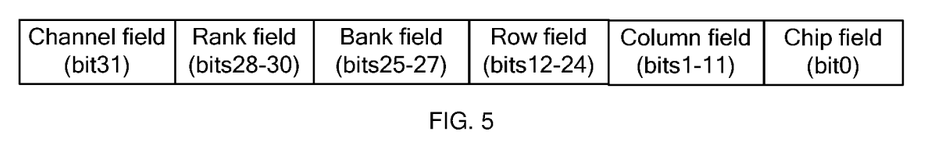
FIG. 5 is a schematic diagram of composition of a DRAM physical address according to an exemplary embodiment.

As shown in FIG. 5, FIG. 5 is a schematic diagram of composition of a DRAM physical address according to an exemplary embodiment of the present disclosure. The composition of the DRAM physical address shown in FIG. 5 includes address fields of the DRAM physical address and bits that describe the corresponding address fields. FIG. 5 shows a 32-bit DRAM physical address. The address fields that describe the DRAM physical address include a chip field, a column field, a row field, a bank field, a rank field, and a channel field. In bits 0 to 31 of the DRAM physical address, bit 0 represents the chip field, bits 1 to 11 represent the column field, bits 12 to 24 represent the row field, bits 25 to 27 represent the bank field, bits 28 to 30 represent the rank field, and bit 31 represents the channel field.

In an exemplary embodiment of the present disclosure, the determining composition of the DRAM physical address according to the attribute of each bit address in the DRAM physical address may include:

determining, according to the attribute of each bit address in the DRAM physical address, positions and a quantity of bit addresses that represent the address fields of the DRAM physical address.

Figure 6:
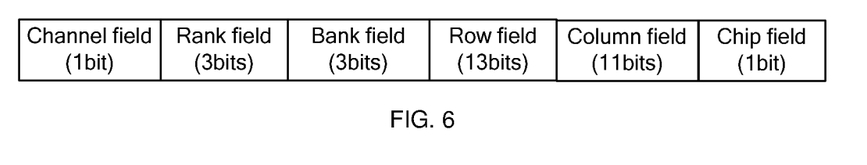
FIG. 6 is a schematic diagram of composition of a DRAM physical address according to an exemplary embodiment.

The composition of the DRAM physical address may include address fields of the DRAM physical address, bits that describe each address field, and locations of the bits in the DRAM physical address. That is, after the attribute of each bit address in the DRAM physical address is determined, positions and a quantity of corresponding address fields that represent the DRAM physical address can be determined. As shown in FIG. 6, FIG. 6 is a schematic diagram of composition of a DRAM physical address according to an exemplary embodiment of the present disclosure. With reference to FIG. 5 and FIG. 6, the chip field is represented by one bit, which is bit 0. The column field is represented by 11 bits, which are bits 1 to 11. The row field is represented by 13 bits, which are bits 12 to 24. The bank field is represented by 3 bits, which are bits 25 to 27. The rank field is represented by 3 bits, which are bits 28 to 30. The channel field is represented by 1 bit, which is bit 31.

By analyzing the attribute of each bit address in the DRAM physical address, the composition corresponding to the DRAM physical address can be determined. For example, the composition includes address fields of the DRAM physical address and bits that describe the address fields, or bits that describe each address field and locations of the bits in the DRAM physical address. In this way, a location of the DRAM physical address can be determined clearly.

By selecting a plurality of DRAM physical addresses with different values of a preset bit address, and determining address fields, affected by the preset bit address, of the DRAM physical addresses, an attribute of the preset bit address is determined, so as to determine composition of the DRAM physical address, thereby determining a physical location of the DRAM physical address. When a problem occurs during access to the DRAM physical address, the problem can be traced and analyzed according to the composition of the DRAM physical address, to determine whether the problem occurs in the channel field, the rank field, the chip field, the bank field, the row field or the column field during access, thereby improving the efficiency of tracing and analysis. Moreover, a hardware problem of the DRAM physical address can also be evaluated in time, to is determine the location of the problem and reduce the risk.

Figure 7:
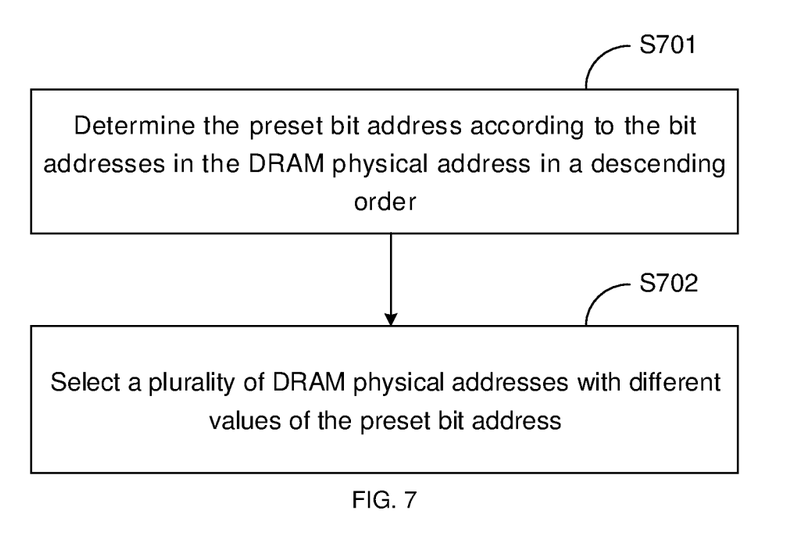
FIG. 7 is a flowchart of a method for selecting a plurality of DRAM physical addresses with different values of a preset bit address according to an exemplary embodiment.

In an exemplary embodiment of the present disclosure, during selection of a plurality of DRAM physical addresses with different values of the preset bit address, the preset bit address may be determined in any manner. For example, the preset bit address may be determined randomly, or determined according to bit addresses in the DRAM physical address in a descending order or an ascending order. The method for selecting a plurality of DRAM physical addresses with different values of the preset bit address is described by using an example in which the preset bit address is determined according to bit addresses in the DRAM physical address in a descending order. As shown in FIG. 7, FIG. 7 is a flowchart of a method for selecting a plurality of DRAM physical addresses with different values of a preset bit address according to an exemplary embodiment of the present disclosure.

S701: Determine the preset bit address according to the bit addresses in the DRAM physical address in a descending order.

S702: Select a plurality of DRAM physical addresses with different values of the preset bit address.

In an exemplary embodiment of the present disclosure, the preset bit address may be determined according to bit addresses in the DRAM physical address in a descending order. For example, for a 32-bit DRAM physical address that includes bit addresses 0 to 31, the preset bit address may be determined in a descending order starting from bit 31, then to bit 30, bit 29 . . . , and bit 0.

When the preset bit address is determined, the preset bit address may be a bit address of one or more bits. This may be specified as required. For example, in the entire analysis process, the quantity of bits of the preset bit address may remain unchanged, which is one or more bits. Alternatively, the preset bit address may include a plurality of address bits at the beginning, and as the analysis goes on, the quantity of address bits is gradually reduced. Alternatively, the preset bit address may include one or more address bits at the beginning, and as the analysis goes on, the quantity of address bits is increased gradually.

After the preset bit address is determined, a plurality of DRAM physical addresses with different values of the preset bit address are selected. Based on the value changes of the preset bit address, one or more address fields affected by the preset bit address are determined, to determine the one or more address fields of the DRAM physical address that are described by the preset bit address.

In an exemplary embodiment of the present disclosure, each bit address in the DRAM physical address may represent one or more address fields. In the mapping relationship table between preset bit addresses and DRAM physical addresses shown in FIG. 3, bit addresses 24 to 27 describe the bank field and the row field. That is, each bit address of bits 24 to 27 of the DRAM physical address represents a bank field and a row field. That is, each bit address of bits 24 to 27 of the DRAM physical address represents a plurality of address fields.

The schematic diagram of the composition of the DRAM physical address in FIG. 5 shows that in bits 0 to 31 of the DRAM physical address, bit 0 represents the chip field, bits 1 to 11 represent the column field, bits 12 to 24 represent the row field, bits 25 to 27 represent the bank field, bits 28 to 30 represent the rank field, and bit 31 represents the channel field. It can be seen that, in the example shown in FIG. 5, each bit address in the DRAM physical address represent only one address field.

In the method for determining an address mapping relationship provided by an exemplary embodiment of the present disclosure, the preset bit address is determined according to different rules, and a plurality of DRAM physical addresses with different values of the preset bit address are selected. Based on value changes of the preset bit address, one or more corresponding address fields affected by the preset bit address are determined, so as to determine the one or more address fields of the DRAM physical address that are described by the preset bit address, thereby determining the address field represented by each bit address in the DRAM physical address, and further determining a physical location of the DRAM physical address. In this way, the present disclosure can trace and analyze problems that occur during access to the DRAM physical address, evaluate a hardware problem of the DRAM physical address in time, and determine a location of the problem.

Figure 8:
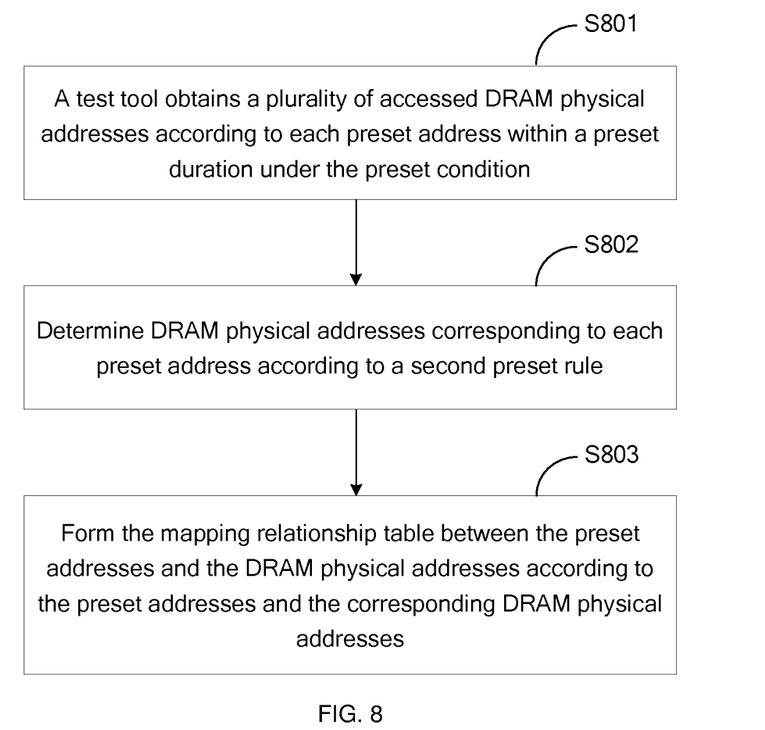
FIG. 8 is a flowchart of a method for obtaining a mapping relationship table between preset addresses and DRAM physical addresses under a preset condition according to an exemplary embodiment.

In an exemplary embodiment of the present disclosure, the method for determining is an address mapping relationship may be executed by a test tool. As shown in FIG. 8, FIG. 8 is a flowchart of a method for obtaining a mapping relationship table between preset addresses and DRAM physical addresses under a preset condition in step S100 according to an exemplary embodiment of the present disclosure.

S801: The test tool obtains a plurality of accessed DRAM physical addresses according to each preset address within a preset duration under the preset condition.

S802: Determine DRAM physical addresses corresponding to each preset address according to a second preset rule.

S803: Form the mapping relationship table between the preset addresses and the DRAM physical addresses according to the preset addresses and the corresponding DRAM physical addresses.

In the exemplary embodiment of the present disclosure, the method for determining an address mapping relationship may be executed by the test tool. The test tool a data capture tool ToolA and a data analysis tool ToolB. ToolA and ToolB may be separate tools, or may be integrated together. Under the preset condition, ToolA may obtain a plurality of accessed DRAM physical addresses according to each preset address within the preset duration. After obtaining the plurality of accessed DRAM physical addresses, ToolB determines DRAM physical addresses corresponding to each preset address according to the second preset rule, and forms the mapping relationship table between the preset addresses and the DRAM physical addresses according to the preset addresses and the corresponding DRAM physical addresses.

In an exemplary embodiment of the present disclosure, the preset address may include a plurality of preset address sequences. When the test tool accesses DRAM physical addresses according to preset addresses to determine a mapping relationship between the plurality of address sequences and the DRAM physical addresses, processing can be performed based on any feasible method. For example, under the preset condition, one of the plurality of preset address sequences may be selected; DRAM physical addresses are accessed cyclically within a fixed period of time, to obtain a plurality of accessed DRAM physical addresses, and DRAM physical addresses corresponding to the preset address are determined according to a second preset rule; is moreover, a mapping relationship between the preset address and the corresponding DRAM physical addresses is established according to the preset address and the corresponding DRAM physical addresses. In a similar manner, a mapping relationship table between the plurality of preset address sequences and the corresponding DRAM physical addresses is established.

In an exemplary embodiment of the present disclosure, the second preset rule may be any rule that can determine the DRAM physical addresses corresponding to each preset address. For example, the determining DRAM physical addresses corresponding to each preset address according to a second preset rule may include: selecting a DRAM physical address, which is accessed for a number of times greater than or equal to a preset threshold, from the plurality of accessed DRAM physical addresses as the DRAM physical address corresponding to the preset address.

After one of the plurality of preset address sequences is selected and DRAM physical addresses are cyclically accessed within a fixed period of time, a plurality of accessed DRAM addresses can be obtained. In a normal state, because the preset address remains unchanged, the plurality of accessed DRAM physical addresses obtained by cyclic access to DRAM addresses should be the same DRAM physical address. However, considering test conditions and uncontrollable factors, if a DRAM physical address in the obtained plurality of accessed DRAM physical addresses is accessed for a number of times greater than a preset access threshold, the DRAM can be considered as the DRAM physical address corresponding to the preset address.

In an exemplary embodiment of the present disclosure, DRAM physical addresses are accessed cyclically according to a plurality of preset address sequences, to determine a mapping relationship between the plurality of preset address sequences and the corresponding DRAM physical addresses, so as to analyze and determine the attribute of each address in the DRAM physical address.

In an exemplary embodiment of the present disclosure, to accurately access real DRAM physical addresses, the method for determining an address mapping relationship needs to be executed by the test tool under the preset condition For example, the preset condition may include:

the test tool is started before an operating system is started up, and the test tool turns off a cache.

In the method for determining a DRAM physical address mapping relationship provided by an exemplary embodiment of the present disclosure, a mapping relationship table between preset addresses and DRAM physical addresses needs to be determined, so as to analyze and determine the attribute of each bit address in the DRAM physical address. To accurately access real DRAM physical addresses, the test tool needs to be started before the operating system is started up, and after turning off the cache, the test tool executes the method for determining a DRAM physical address mapping relationship.

Figure 9:
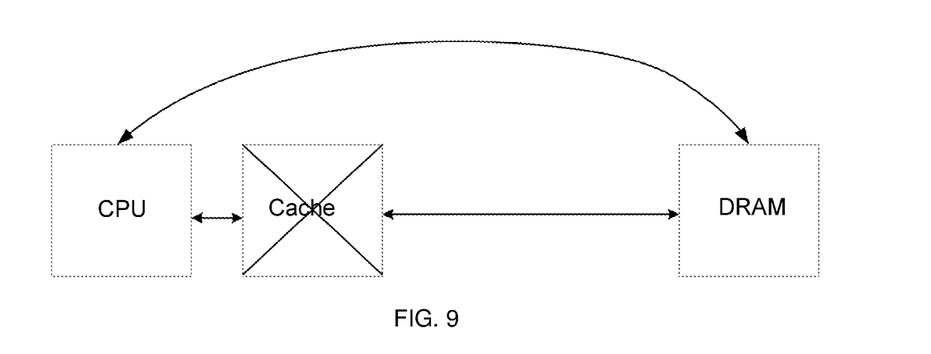
FIG. 9 is a schematic processing diagram of executing a DRAM physical address mapping relationship by a test tool after turning off a cache according to an exemplary embodiment.

As illustrated in FIG. 9, FIG. 9 is a schematic processing diagram of executing a DRAM physical address mapping relationship by a test tool after turning off a cache according to an exemplary embodiment of the present disclosure. After the test tool turns off the cache, the CPU no longer accesses DRAM physical addresses via the cache, but directly accesses DRAM physical addresses, ensuring that real DRAM physical addresses can be accessed.

Before the operating system is started up, a memory management unit (MMU) of the operating system does not work; it is unnecessary to convert a virtual address into a physical address, and interference from the operating system to the access to DRAM can be avoided. The test tool turns off the cache, to ensure that the DRAM is accessed directly instead of being accessed via the cache, and also improve the operation speed of access.

In an exemplary embodiment of the present disclosure, a mapping relationship between the preset address sequences and the DRAM physical addresses is determined, and values of bit addresses in each DRAM physical address are analyzed according to the mapping relationship, to determine attributes of the bit addresses in the DRAM physical address. In this way, a physical location of each DRAM physical address can be clearly determined, which can trace and analyze problems that occur during access to the DRAM physical address, and improve the accuracy and efficiency of evaluating threats caused by the hardware problem of the DRAM physical address.

Figure 10:
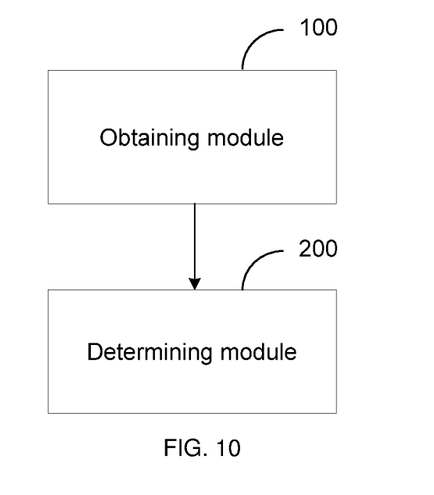
FIG. 10 is a block diagram of an apparatus for determining an address mapping relationship according to an exemplary embodiment.

FIG. 10 is a block diagram of an apparatus for determining an address mapping relationship according to an exemplary embodiment. The apparatus is configured to implement the foregoing method for determining an address mapping relationship. The apparatus includes:

an obtaining module 100 configured to obtain a mapping relationship table between preset addresses and DRAM physical addresses under a preset condition; and a determining module 200 configured to analyze values of bit addresses in the DRAM physical address according to a first preset rule, to determine an attribute of each bit address in the DRAM physical address, where the attribute is used for representing an address field of the DRAM physical address.

Figure 11:
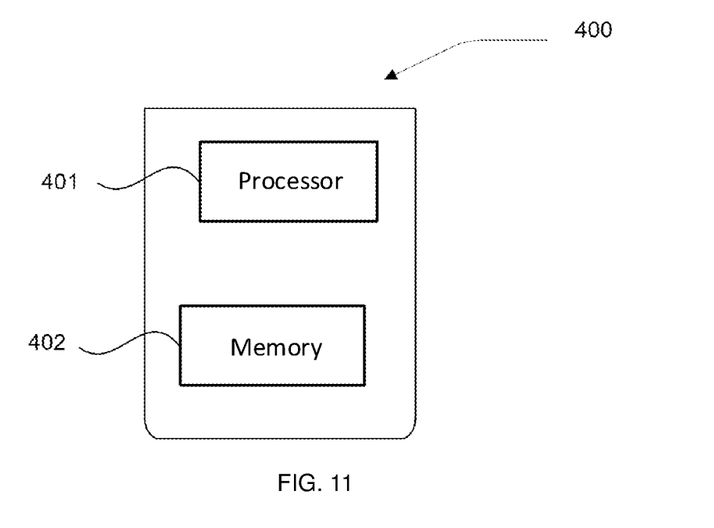
FIG. 11 is a block diagram of an apparatus for determining an address mapping relationship according to an exemplary embodiment.

FIG. 11 is a block diagram of an apparatus for determining an address mapping relationship according to an exemplary embodiment, for example, a block diagram of a computer device 400. For example, the computer device 400 can be provided as a terminal device. Referring to FIG. 11, the computer device 400 includes a processor 401, and one or more processors may be set as required. The computer device 400 further includes a memory 402, configured to store an instruction executable by the processor 401, such as an application program. One or more memories may be set as required. The memory may store one or more application programs. The processor 401 is configured to execute the instruction to perform the above-mentioned method.

Persons skilled in the art should understand that the embodiments of the present disclosure may be provided as a method, an apparatus (device), or a computer program product. Therefore, the present disclosure may use a form of hardware only embodiments, software only embodiments, or embodiments with a combination of software and hardware. Moreover, the present disclosure may be in a form of a computer program product that is implemented on one or more computer-usable storage media that include computer-usable program code. The computer storage media include volatile and non-volatile, removable and non-removable media implemented in any method or technology for storing information (such as computer-readable instructions, data structures, program modules, or other data), including but not limited to, a random access memory (RAM), a read-only memory (ROM), an electrically erasable programmable read-only memory (EEPROM), a flash memory or other storage technologies, a compact disc read-only memory (CD-ROM), a digital versatile disk (DVD) or other optical disc storage, a magnetic cassette, a magnetic tape, magnetic disk storage or other magnetic storage apparatuses, or any other medium that can be used to store desired information and can be accessed by a computer. In addition, as is well known to persons skilled in the art, communication media usually contain computer-readable instructions, data structures, program modules, or other data in modulated data signals such as carrier waves or other transmission mechanisms, and may include any information transfer medium.

In an exemplary embodiment, a non-transitory computer-readable storage medium including an instruction is provided, for example, the memory 402 including the instruction, and the instruction may be executed by the processor 401 of the computer device 400 to accomplish the method described above. For example, the non-transitory computer-readable storage medium may be a ROM, a RAM, a CD-ROM, a magnetic tape, a floppy disk, an optical data storage device, or the like.

An exemplary embodiment of the present of the disclosure provides a non-transitory computer readable storage medium is provided, where when executed by a processor of an apparatus for determining an address mapping relationship, instructions in the non-transitory computer readable storage medium enable the apparatus to execute the method for determining an address mapping relationship provided in the exemplary embodiments of the present disclosure.

The present disclosure is described with reference to the flowcharts and/or block diagrams of the method, the apparatus (device), and the computer program product according to the embodiments of the present disclosure. It should be understood that computer program instructions may be used to implement each process and/or each block in the flowcharts and/or the block diagrams and a combination of a process and/or a block in the flowcharts and/or the block diagrams. These computer program instructions may be provided for a general-purpose computer, a dedicated computer, an embedded processor, or a processor of any other programmable data processing device to generate a machine, such that the instructions executed by a computer or a processor of any other programmable data processing device generate an apparatus for implementing a specific function in one or more processes in the flowcharts and/or in one or more blocks in the block diagrams.

These computer program instructions may also be stored in a computer readable memory that can instruct a computer or another programmable data processing device to work in a specific manner, such that the instructions stored in the computer readable memory generate an artifact that includes an instruction apparatus. The instruction apparatus implements a specific function in one or more processes in the flowcharts and/or in one or more blocks in the block diagrams.

These computer program instructions may also be loaded onto a computer or another programmable data processing device, such that a series of operations and steps are performed on the computer or the another programmable device, thereby generating computer-implemented processing. Therefore, the instructions executed on the computer or the another programmable device provide steps for implementing a specific function in one or more processes in the flowcharts and/or in one or more blocks in the block diagrams.

In the present disclosure, the terms "include", "comprise", or any other variations thereof are intended to cover a non-exclusive inclusion, such that an article or a device including a series of elements not only includes those elements, but also includes other elements that are not explicitly listed, or also includes inherent elements of the article or the device. Without more restrictions, the elements defined by the statement "including a . . ." do not exclude the existence of other identical elements in the article or device including the elements.

Although some preferred embodiments of the present disclosure have been described, persons skilled in the art can make changes and modifications to these embodiments once they learn the basic inventive concept. Therefore, the appended claims are intended to be interpreted as including the preferred embodiments and all changes and modifications falling within the scope of the present disclosure.

Apparently, persons skilled in the art can make various changes and modifications to the present disclosure without departing from the spirit and scope of the present disclosure. In this way, if these changes and modifications to the present disclosure fall within the scope of the claims of the present disclosure and equivalent technologies thereof, the present disclosure is further intended to include these changes and is modifications.

INDUSTRIAL APPLICABILITY

In the method and apparatus for determining an address mapping relationship, and a storage medium, by analyzing values of bit addresses in a DRAM physical address, an address field corresponding to each bit address in the DRAM physical address is determined, such that composition of the DRAM physical address can be obtained through parsing, which facilitates degubbing, modification and analysis of problems related to the DRAM physical address, and improves the accuracy and efficiency of evaluating threats of the loophole of the DRAM physical address.

The invention claimed is:

1. A method for determining an address mapping relationship, comprising:
  obtaining a mapping relationship table between preset addresses and dynamic random access memory (DRAM) physical addresses under a preset condition; and
  analyzing values of bit addresses in each of the DRAM physical addresses according to a first preset rule, to determine an attribute of each bit address in each of the DRAM physical addresses, wherein the attribute is used for representing an address field of each of the DRAM physical addresses;
  wherein the method is executed by a test tool; and
  the obtaining a mapping relationship table between preset addresses and DRAM physical addresses under a preset condition comprises:
    obtaining, by the test tool, a plurality of accessed DRAM physical addresses according to each preset address within a preset duration under the preset condition;
    determining the DRAM physical addresses corresponding to each preset address according to a second preset rule; and
    forming the mapping relationship table between the preset addresses and the DRAM physical addresses according to the preset addresses and the corresponding DRAM physical addresses;
    wherein the determining the DRAM physical addresses corresponding to each preset address according to a second preset rule comprises:
      selecting a DRAM physical address, which is accessed for a number of times greater than or equal to a preset threshold, from the plurality of accessed DRAM physical addresses as the DRAM physical address corresponding to the preset address.

2. The method for determining an address mapping relationship of claim 1, wherein the analyzing values of bit addresses in each of the DRAM physical addresses according to a first preset rule, to determine an attribute of each bit address in each of the DRAM physical addresses comprises:

selecting a plurality of DRAM physical addresses from the DRAM physical addresses with different values of a preset bit address, and determining an address field of the plurality of DRAM physical addresses that is affected by the preset bit address, to determine an attribute of the preset bit address.

3. The method for determining an address mapping relationship of claim 1, further comprising:

determining composition of each of the DRAM physical addresses according to the attribute of each bit address in each of the DRAM physical addresses.

4. The method for determining an address mapping relationship of claim 3, wherein the address field comprises one or more of a channel address field, a rank address field, a chip field, a bank address field, a byte address field, a row address field, or a column address field.

5. The method for determining an address mapping relationship of claim 4, wherein the determining composition of each of the DRAM physical addresses according to the attribute of each bit address in each of the DRAM physical addresses comprises:

determining, according to the attribute of each bit address in each of the DRAM physical addresses, positions of bit addresses and a quantity of the bit addresses that represent the address fields of each of the DRAM physical addresses.

6. The method for determining an address mapping relationship of claim 5, wherein each bit address in each of the DRAM physical addresses represents one or more address fields.

7. The method for determining an address mapping relationship of claim 2, wherein the selecting a plurality of DRAM physical addresses from the DRAM physical addresses with different values of a preset bit address comprises:

determining the preset bit address according to the bit addresses in each of the DRAM physical addresses in a descending order; and     selecting the plurality of DRAM physical addresses from the DRAM physical addresses with different values of the preset bit address.

8. The method for determining an address mapping relationship of claim 7, wherein the preset bit address comprises a bit address of one or more bits in the DRAM physical addresses.

9. The method for determining an address mapping relationship of claim 1, wherein the preset condition comprises: the test tool is started before an operating system is started up, and the test tool turns off a cache.

10. An apparatus for determining an address mapping relationship, comprising:

one or more processors; and a storage apparatus, configured to store one or more programs, wherein the one or more programs, when executed by the one or more processors, cause the one or more processors to execute operations of:

obtaining a mapping relationship table between preset addresses and dynamic random access memory (DRAM) physical addresses under a preset condition; and         analyzing values of bit addresses in each of the DRAM physical addresses according to a first preset rule, to determine an attribute of each bit address in each of the DRAM physical addresses, wherein the attribute is used for representing an address field of each of the DRAM physical addresses;

wherein the one or more processors are part of a test tool; and the obtaining a mapping relationship table between preset addresses and DRAM physical addresses under a preset condition comprises:

obtaining, by the test tool, a plurality of accessed DRAM physical addresses according to each preset address within a preset duration under the preset condition;

determining the DRAM physical addresses corresponding to each preset address according to a second preset rule; and     forming the mapping relationship table between the preset addresses and the DRAM physical addresses according to the preset addresses and the corresponding DRAM physical addresses;

wherein the determining the DRAM physical addresses corresponding to each preset address according to a second preset rule comprises:

selecting a DRAM physical address, which is accessed for a number of times greater than or equal to a preset threshold, from the plurality of accessed DRAM physical addresses as the DRAM physical address corresponding to the preset address.

11. A non-transitory computer readable storage medium, wherein when executed by a processor of an apparatus for determining an address mapping relationship, instructions in the non-transitory computer readable storage medium enable the apparatus to perform the method of claim 1.

* * * * *